United States Patent
Woolley et al.

(10) Patent No.: US 9,459,737 B2
(45) Date of Patent: Oct. 4, 2016

(54) PROXIMITY DETECTION USING MULTIPLE INPUTS

(75) Inventors: Adrian Woolley, Pleasanton (CA); John Logan, Danville (CA)

(73) Assignee: Atmel Corporation, San Jose, CA (US)

( * ) Notice: Subject to any disclaimer, the term of this patent is extended or adjusted under 35 U.S.C. 154(b) by 256 days.

(21) Appl. No.: 13/479,068

(22) Filed: May 23, 2012

(65) Prior Publication Data

US 2013/0314365 A1 Nov. 28, 2013

(51) Int. Cl.
G06F 3/044 (2006.01)
G06F 1/32 (2006.01)
G06F 3/042 (2006.01)

(52) U.S. Cl.
CPC .............. *G06F 3/044* (2013.01); *G06F 1/3262* (2013.01); *G06F 3/042* (2013.01); *G06F 2203/04101* (2013.01); *G06F 2203/04106* (2013.01)

(58) Field of Classification Search
CPC ................................ G06F 3/041; G06F 3/044
USPC ......... 345/173, 156, 174, 158, 169; 315/154
See application file for complete search history.

(56) References Cited

U.S. PATENT DOCUMENTS

| | | | |
|---|---|---|---|
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 8,723,824 B2 | 5/2014 | Myers | |
| 2007/0115265 A1* | 5/2007 | Rainisto | 345/173 |
| 2008/0284753 A1* | 11/2008 | Hsu et al. | 345/174 |
| 2008/0309635 A1 | 12/2008 | Matsuo | |
| 2009/0195497 A1* | 8/2009 | Fitzgerald | G06F 1/3203 345/156 |
| 2009/0315854 A1 | 12/2009 | Matsuo | |
| 2011/0001708 A1* | 1/2011 | Sleeman | 345/173 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2012/0320385 A1* | 12/2012 | Mu et al. | 356/624 |
| 2013/0076612 A1 | 3/2013 | Myers | |
| 2013/0169166 A1* | 7/2013 | Zhang | 315/154 |
| 2013/0201102 A1* | 8/2013 | Klinghult | 345/156 |

FOREIGN PATENT DOCUMENTS

| | | | | |
|---|---|---|---|---|
| WO | WO 2012/052069 | * | 4/2012 | ............ G06F 3/041 |
| WO | WO 2012/129247 | | 9/2012 | |

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Olga Merkoulova
(74) *Attorney, Agent, or Firm* — Baker Botts L.L.P.

(57) ABSTRACT

In one embodiment, a method includes determining, by a capacitive touch sensor of a device, a presence of an object; activating an optical sensor of the device in response to determining the presence of the object; and determining, by the optical sensor of the device, a touch or proximity input within a proximity-sensing volume.

20 Claims, 3 Drawing Sheets

PROXIMITY DETECTION USING MULTIPLE INPUTS

TECHNICAL FIELD

This disclosure generally relates to proximity detection.

BACKGROUND

A touch sensor may detect the presence and location of a touch or the proximity of an object (such as a user's finger or a stylus) within a touch-sensitive area of the touch sensor overlaid on a display screen, for example. In a touch-sensitive display application, the touch sensor may enable a user to interact directly with what is displayed on the screen, rather than indirectly with a mouse or touchpad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are different types of touch sensors, such as (for example) resistive touch screens, surface acoustic wave touch screens, and capacitive touch screens. Herein, reference to a touch sensor may encompass a touch screen, and vice versa, where appropriate. A capacitive touch screen may include an insulator coated with a substantially transparent conductor in a particular pattern. When an object touches or comes within proximity of the surface of the capacitive touch screen, a change in capacitance may occur within the touch screen at the location of the touch or proximity. A controller may process the change in capacitance to determine its position on the touch screen.

DESCRIPTION OF EXAMPLE EMBODIMENTS

Figure 1:
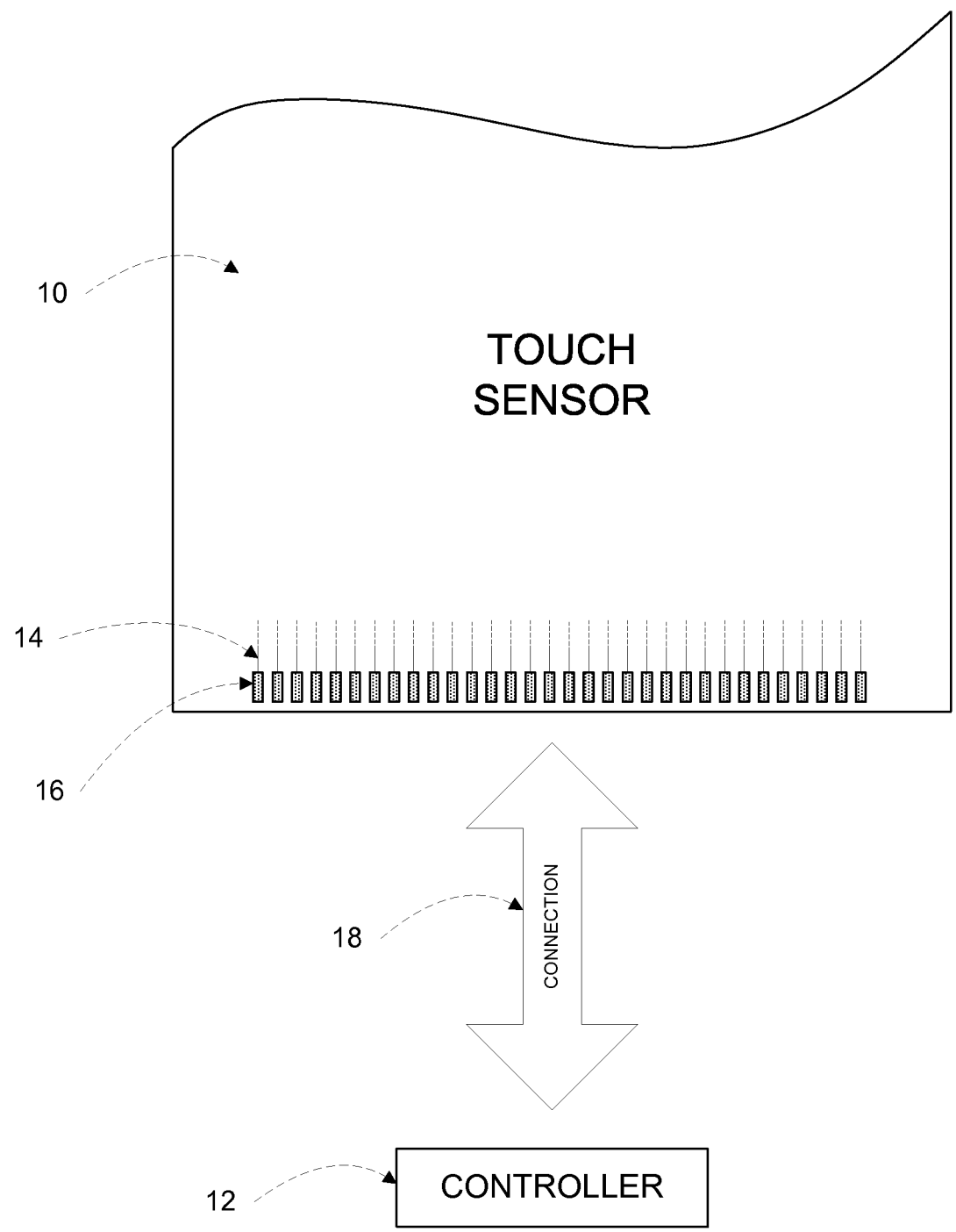
FIG. 1 illustrates example touch sensor with an example controller.

FIG. 1 illustrates an example touch sensor 10 with an example controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% of the area of its shape. As an example and not by way of limitation, an electrode may be made of fine lines of metal or other conductive material (such as for example copper, silver, or a copper- or silver-based material) and the fine lines of conductive material may occupy substantially less than 100% of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 microns ($\mu$m) or less and a width of approximately 10 $\mu$m or less. As another example, one or more portions of the conductive material may be silver or silver-based and similarly have a thickness of approximately 5 $\mu$m or less and a width of approximately 10 $\mu$m or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
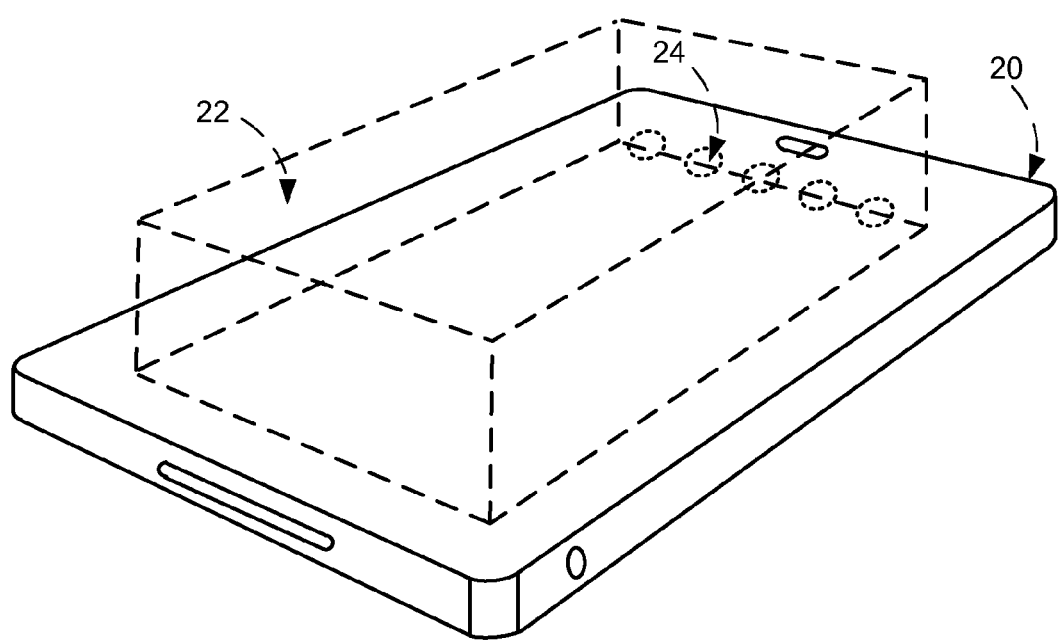
FIG. 2 illustrates an example device implementing example proximity detection sensing.

FIG. 2 illustrates an example device implementing an example proximity sensing. As an example and not by way of limitation, device 20 may include a smartphone, a personal-digital assistant (PDA), a tablet computer, a laptop computer, a desktop computer, a kiosk computer, a satellite navigation device, a portable media player, a portable game console, a point-of-sale device, another suitable device, a suitable combination of two or more of these, or a suitable portion of one or more of these. Device 20 may have any number of sensors that may operate using different forms of sensing, e.g. optical, capacitive, etc. The different forms of sensing, individually or in combination, may be used to detect a touch or proximity input. In the example of FIG. 2, device 20 includes a capacitive touch sensor and an optical sensor. The touch sensor has a proximity-sensing volume that substantially originates at a touch-sensitive area proximate to a surface of device 20 and substantially ending at a distance from the surface beyond which a proximity input is substantially not detectable by the capacitive touch sensor. The optical sensor includes with one or more optical emitters 24 and detectors positioned adjacent to the touch-sensitive area of the touch sensor and has a proximity-sensing volume such that the optical proximity-sensing volume overlaps at least a portion of the capacitive proximity-sensing volume. The overlap between the capacitive and optical proximity-sensing volumes results in a proximity sensing-volume 22 for device 20. Although this disclosure illustrates a proximity-sensing volume 22 of the device having a particular shape, this disclosure contemplates a proximity-sensing volume 22 having any suitable shape or dimensions. In particular embodiments, emitters 24 may be located underneath a darkened bezel surrounding the touch-sensitive area.

Emitters 24 of the optical sensor transmits an optical signal and the detector of the optical sensor generates a signal proportional to the strength of the signal reflected by the object. As an example and not by way of limitation, emitters 24 may be light-emitting diodes (LED) that transmit radiation with wavelength substantially within the infrared (IR) portion of the electromagnetic (EM) spectrum. The optical sensor may be combined with the capacitive touch sensor to provide proximity, motion sensing, or gesture recognition. Although this disclosure describes and illustrates a particular combination of optical sensor and capacitive touch sensor with particular components having a particular arrangement, this disclosure contemplates any suitable combination of sensors having any suitable implementation with any suitable components.

In particular embodiments, the capacitive touch sensor and the optical sensor may be coupled to the controller of the touch sensor. The controller may process measurement signals from the capacitive touch sensor and the optical sensor to detect the presence and location of one or more touch or proximity inputs within capacitive proximity-sensing volume 22 based on capacitive sensing and the strength of the signal reflected by the object causing the touch or proximity input, respectively. Although this disclosure describes processing of the signals detected by the sensors being performed by a particular controller, this disclosure contemplates processing of the sensor signals by any suitable processing component, such as for example a processor of the device.

In particular embodiments, the capacitive touch sensor of device 20 may provide initial proximity sensing and the operation of the optical sensor may be toggled based on the data of the capacitive touch sensor. Data supplied by the capacitive touch sensor may be analyzed to detect the presence of an object within capacitive proximity-sensing volume 22 of device 20. As an example and not by way of limitation, upon detecting the presence of an object within proximity-sensing volume 22, device 20 may be activated from a power-saving state to a normal operating state. As another example, device 20 may reduce the power of a signal transmitted by an antenna in response to detecting the presence of a user for specific absorption rate (SAR) compliance. In particular embodiments, the entire array of the touch sensor is scanned. In other particular embodiments, a reduced portion of the capacitive touch sensor that overlaps the area of coverage of the optical sensor is scanned to increase the refresh rate of the proximity sensing or decrease the power consumption of device 20.

As an example and not by way of limitation, based on the determination, the controller may activate emitters 24 of the optical sensor. Radiation transmitted by emitters 24 may be reflected by the object within proximity-sensing volume 22 and the reflected radiation detected by the optical sensor. The strength of the reflected signal is dependent at least in part to the distance between the object and emitters 24, and the reflectivity of the object at the wavelength of radiation of emitters 24. Signals supplied by the optical sensor may be analyzed to detect a touch or proximity input caused by the object within proximity-sensing volume 22 of device 20. As an example and not by way of limitation, the controller of device 20 may determine a touch or proximity input has occurred in response to the strength of the reflected signal detected by the optical sensor is above a pre-determined threshold value. In particular embodiments, device 20 may revert to the power-saving state once the presence of the object is no longer detected. As an example and not by way of limitation, emitters 24 of the optical sensor may be deactivated in response to the strength of the reflected signal detected by the optical sensor falling below a pre-determined lower threshold value. Although this disclosure describes touch or proximity input detection using a particular operation of the optical sensor and touch sensor, this disclosure contemplates touch or proximity input detection using any suitable operation of the optical and touch sensors, such as for example a pre-determined alternating sequence between the touch and the optical sensor.

The use of multiple emitters 24 enhances motion or gesture detection based the direction of the motion of the object. In particular embodiments, multiple emitters 24 may be scanned or activated in a pre-determined sequence and controller may process the reflected signal from the sequenced emitters 24 to determine the motion of the object. As an example and not by way of limitation, multiple emitters 24 may be used by the optical sensor determine the direction of motion of the object, e.g. a hand, thereby initiating a pre-determined function of device 20, such as activating a touch screen of device 20 or unlocking an electronic lock. If motion has a second direction, the object may initiate a second pre-determined function of device 20, such as deactivating the touch screen or locking the electronic lock. By moving a hand in one direction, the user may activate device 20 and by moving the hand in another direction, the user may deactivate device 20. In other particular embodiments, sequencing emitters 24 may enhance detecting and locating a multi-touch input within proximity-sensing volume 22. As an example and not by way of limitation, a pinching gesture with two fingers may initiate a pre-determined function, such as for example zooming in on an image on a display of device 20.

Combining differing forms of sensing may be used to validate a proximity or touch input detection. In particular embodiments, the touch sensor and optical sensor may be used in combination to verify the results provided by each of type of sensor. As an example and not by way of limitation, the capacitive touch sensor may operate high-sensitivity mode to enhance detection of objects with poorly conducting surfaces. Operating the touch sensor in the high-sensitivity mode increases the probability of false detection of an object due to increased signal noise. When the touch sensor registers a detection event, the optical sensor may be used to verify the presence of the object through a reflected optical signal, as described above. Otherwise, the controller may reject the touch or proximity input may be rejected as noise if the reflected optical signal detected by the optical sensor is below the pre-determined lower threshold value, as described above.

Differing forms of sensing may be used in combination to differentiate between different types of objects. As an example and not by way of limitation, the combination of the reflectivity and the conductivity of the object will affect the signal strength of the capacitive and optical returns, respectively. Non-conductive objects such as for example a cover of device 20, a table top, or a gloved hand may be difficult to detect capacitively. In contrast, objects with low optical reflectivity such as for example dark surfaces or objects with a rough surface may be difficult to detect optically. By using both forms of sensing, the controller may differentiate between different types of object providing a touch or proximity input within proximity-sensing volume 22. As an example and not by way of limitation, device 20 may differentiate between touch or proximity input from a leg of a user as compared to input from a table top based on optical and capacitive sensing. As another example, device 20 may differentiate between a touch-input from the cover of device 20 as compared to a hand of the user. Moreover, device 20 may have a response to a touch or proximity input based on the type of object providing the input. As an example and not by way of limitation, device 20 may have no response to a touch input from the cover of device 20 and may activate the display of device 20 in response to the touch input from the hand of the user.

Figure 3:
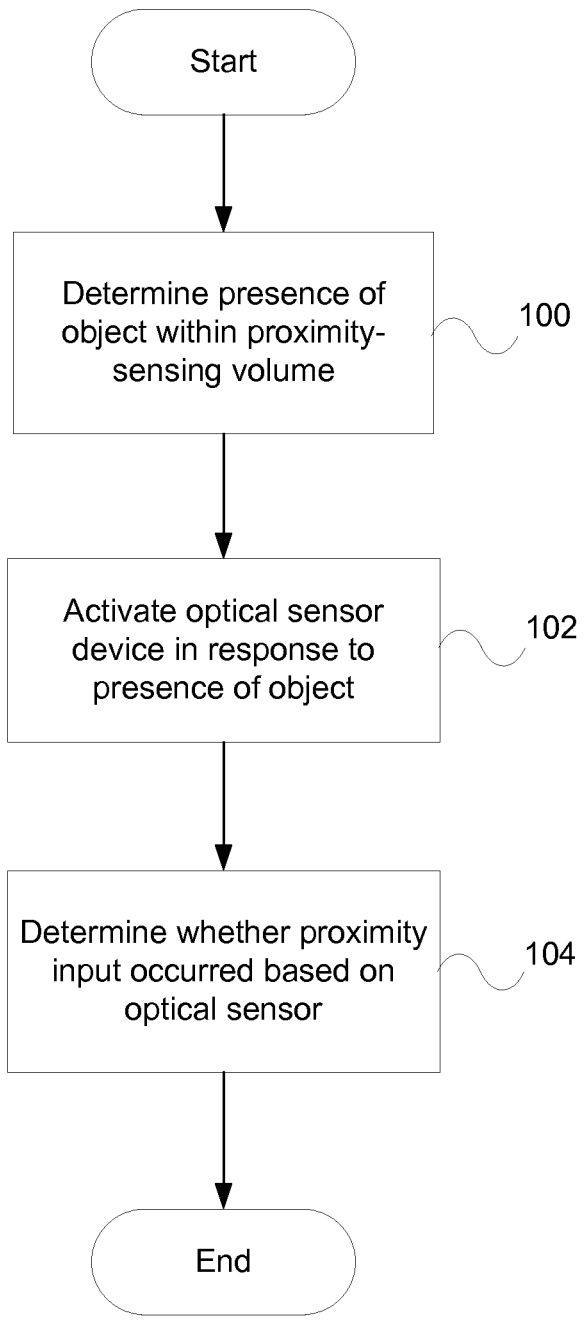
FIG. 3 illustrates an example method for touch or proximity input detection.

FIG. 3 illustrates an example method for touch or proximity input detection. The method starts at step 100, where the presence of an object within a proximity-sensing volume of the capacitive touch sensor is determined. In particular embodiments, the presence of the object is determined by a capacitive touch sensor of a device. Step 102 activates an optical sensor of the device in response to determining the presence of the object. In particular embodiments, activating the optical sensor causes emitters to transmit radiation with a wavelength within the IR portion of the EM spectrum. At step 104, a touch or proximity input within the proximity-sensing volume whether a touch or proximity input within the proximity-sensing volume has occurred is determined by the optical sensor of the device, at which point the method may end. Although this disclosure describes and illustrates particular steps of the method of FIG. 3 as occurring in a particular order, this disclosure contemplates any suitable steps of the method of FIG. 3 occurring in any suitable order. Moreover, although this disclosure describes and illustrates particular components carrying out particular steps of the method of FIG. 3, this disclosure contemplates any suitable combination of any suitable components carrying out any suitable steps of the method of FIG. 3.

Herein, a computer-readable non-transitory storage medium or media may include one or more semiconductor-based or other ICs (such, as for example, field-programmable gate arrays (FPGAs) or ASICs), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL (SD) cards or drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
   determining, by a capacitive sensor of a device, a presence of a physical object;
   activating one or more emitters of an optical sensor of the device in response to determining the presence of the physical object, wherein the optical sensor is operable to toggle, based on data received from the capacitive sensor, between an activated state and a deactivated state;
   determining, by the optical sensor of the device, a touch or proximity input within a proximity-sensing volume of the device, the touch or proximity caused by the physical object; and
   distinguishing a type of the physical object based on a signal strength from the capacitive sensor and a signal strength from the optical sensor, wherein the capacitive sensor is a capacitive touch sensor.

2. The method of claim 1, wherein the optical sensor is sensitive to radiation with wavelength substantially within an infrared (IR) portion of the electromagnetic spectrum.

3. The method of claim 1, wherein the optical sensor is located such that an area of coverage of the optical sensor overlaps at least a portion of a capacitive proximity-sensing volume.

4. The method of claim 1, further comprising:
   determining a direction of motion of the physical object within the proximity-sensing volume of the device; and
   initiating a pre-determined function of the device based on the direction of motion.

5. The method of claim 1, further comprising deactivating the optical sensor in response to the optical sensor determining the physical object is no longer present.

6. The method of claim 1, further comprising verifying the presence of the physical object through the optical sensor.

7. The method of claim 1, wherein:
   the capacitive sensor is configured to detect presence of the physical object with a higher sensitivity than the optical sensor; and
   the method further comprises:
      accepting the presence of the physical object when a signal due to the determined touch or proximity input determined by the optical sensor exceeds a threshold; and
      rejecting the presence of the physical object when a signal due to the determined touch or proximity input determined by the optical sensor falls below the threshold.

8. A computer-readable non-transitory storage medium embodying logic configured when executed to:
   determine, by a capacitive sensor of a device, a presence of a physical object, the capacitive sensor being a capacitive touch sensor;
   activate one or more emitters of an optical sensor of the device in response to determining the presence of the physical object, wherein the optical sensor is operable to toggle, based on data received from the capacitive sensor, between an activated state and a deactivated state;
   determine, by the optical sensor of the device, a touch or proximity input within a proximity-sensing volume of the device, the touch or proximity caused by the physical object; and
   distinguish, based on a signal strength from the capacitive sensor and a signal strength from the optical sensor, a type of the physical object.

9. The medium of claim 8, wherein the optical sensor is sensitive to radiation with wavelength substantially within an infrared (IR) portion of the electromagnetic spectrum.

10. The medium of claim 8, wherein the optical sensor is located such that an area of coverage of the optical sensor overlaps at least a portion of a capacitive proximity-sensing volume.

11. The medium of claim 8, wherein the logic is further configured to:
    determine a direction of motion of the physical object within the proximity-sensing volume of the device; and
    initiate a pre-determined function of the device based on the direction of motion.

12. The medium of claim 8, wherein the logic is further configured to deactivate the optical sensor in response to the optical sensor determining the physical object is no longer present.

13. The medium of claim 8, wherein the logic is further configured to verify the presence of the physical object through the optical sensor.

14. The medium of claim 8, wherein:
the capacitive sensor is configured to detect presence of the physical object with a higher sensitivity than the optical sensor; and
the logic is further configured to:
accept the presence of the physical object when a signal due to the determined touch or proximity input determined by the optical sensor exceeds a threshold; and
reject the presence of the physical object when a signal due to the determined touch or proximity input determined by the optical sensor falls below the threshold.

15. A device comprising:
a capacitive sensor having a capacitive proximity-sensing volume, the capacitive sensor being a capacitive touch sensor;
an optical sensor; and
a computer-readable non-transitory storage media coupled to the capacitive touch sensor and the optical sensor and embodying logic configured when executed to:
determine a presence of a physical object;
activate one or more emitters of the optical sensor in response to determining the presence of the physical object, wherein the optical sensor is operable to toggle, based on data received from the capacitive sensor, between an activated state and a deactivated state;
determine a touch or proximity input within a proximity-sensing volume of the device through the optical sensor, the touch or proximity caused by the physical object; and
distinguish, based on a signal strength from the capacitive sensor and a signal strength from the optical sensor, a type of the physical object.

16. The device of claim 15, wherein the logic is further configured to:
determine a direction of motion of the physical object within the proximity-sensing volume of the device; and
initiate a pre-determined function of the device based on the direction of motion.

17. The device of claim 15, wherein the optical sensor is located such that an area of coverage of the optical sensor overlaps at least a portion of the capacitive proximity-sensing volume.

18. The device of claim 15, wherein the logic is further configured to deactivate the optical sensor in response to the optical sensor determining the physical object is no longer present.

19. The device of claim 15, wherein the logic is further configured to verify the presence of the physical object through the optical sensor.

20. The device of claim 15, wherein:
the capacitive sensor is configured to detect presence of the physical object with a higher sensitivity than the optical sensor; and
the logic is further configured to:
accept the presence of the physical object when a signal due to the determined touch or proximity input determined by the optical sensor exceeds a threshold; and
reject the presence of the physical object when a signal due to the determined touch or proximity input determined by the optical sensor falls below the threshold.

* * * * *